(12) United States Patent
Miwa (10) Patent No.: US 8,287,287 B2
(45) Date of Patent: Oct. 16, 2012

(54) FILM-SHAPED ELECTRICALLY CONNECTING BODY AND MANUFACTURING METHOD THEREOF

(75) Inventor: Kazuiku Miwa, Obu (JP)

(73) Assignee: NGK Insulators, Ltd., Nagoya (JP)

( * ) Notice: Subject to any disclaimer, the term of this patent is extended or adjusted under 35 U.S.C. 154(b) by 131 days.

(21) Appl. No.: 12/821,596

(22) Filed: Jun. 23, 2010

(65) Prior Publication Data

US 2011/0045695 A1 Feb. 24, 2011

(30) Foreign Application Priority Data

Aug. 18, 2009 (JP) ................................. 2009-189086

(51) Int. Cl.
*H01R 12/00* (2006.01)
(52) U.S. Cl. ........................................ 439/66; 439/67
(58) Field of Classification Search ................ 439/66, 439/67
See application file for complete search history.

(56) References Cited

U.S. PATENT DOCUMENTS

| | | | |
|---|---|---|---|
| 3,862,790 A | 1/1975 | Davies et al. | |
| 4,295,700 A | 10/1981 | Sado | |
| 5,173,055 A | 12/1992 | Grabbe | |
| 6,045,367 A | 4/2000 | Maldonado | |
| 6,146,151 A | 11/2000 | Li | |
| 6,328,573 B1 | 12/2001 | Sakata et al. | |
| 6,562,179 B1* | 5/2003 | Ikeguchi et al. | 156/307.5 |
| 7,621,761 B2* | 11/2009 | Mok et al. | 439/81 |
| 2002/0055282 A1* | 5/2002 | Eldridge et al. | 439/66 |
| 2002/0133944 A1 | 9/2002 | Lopata et al. | |
| 2003/0045136 A1 | 3/2003 | Suzuki et al. | |
| 2003/0064635 A1 | 4/2003 | Ochiai | |
| 2004/0163250 A1 | 8/2004 | Lopata et al. | |
| 2004/0266246 A1 | 12/2004 | Hashimoto et al. | |
| 2006/0030169 A1* | 2/2006 | Noda et al. | 439/66 |
| 2006/0276059 A1* | 12/2006 | Dittmann et al. | 439/67 |

FOREIGN PATENT DOCUMENTS

| | | |
|---|---|---|
| JP | 3703748 | 7/2005 |
| JP | 3753615 | 12/2005 |
| JP | 3847227 | 9/2006 |
| JP | 3860561 | 9/2006 |
| JP | 4102196 | 3/2008 |

* cited by examiner

*Primary Examiner* — Hien Vu
(74) *Attorney, Agent, or Firm* — Burr & Brown (57) ABSTRACT

A film-shaped electrically-connecting body 1 is used for electrically connecting a plurality of electronic devices and includes: two insulation sheets having a plurality of opening portions formed therein at a regular interval, and a plurality of plate-shaped connection elements; a part of each of the connection elements being held between the two insulation sheets, the other part where the connection element is not held being extended from the portion held to the opening portion and bent to form a contact point with a terminal of the electric device, and the two insulation sheets being unified at a portion where the connection element is not present therebetween. The two insulation sheets are formed by screen printing using a material having electrical insulation and elasticity and being dissolved in a solvent as an ink for printing.

11 Claims, 6 Drawing Sheets

FILM-SHAPED ELECTRICALLY CONNECTING BODY AND MANUFACTURING METHOD THEREOF

BACKGROUND OF THE INVENTION

1. Field of The Invention

The present invention relates to an electrically-connecting body for electrically connecting electronic devices such as an integrated circuit and a printed-circuit board provided with a surface mount spherical terminal or a flat surface type terminal used for various equipments together and to a manufacturing method thereof. In particular, the present invention relates to a thin (film-shaped) electrically-connecting body used for a high frequency test or the mounting of an electronic device and to a manufacturing method thereof.

2. Description of Related Art

In order to connect two electronic devices together, that is, in order to electrically connect a plurality of terminals disposed on the two electronic devices together, there is used an electrically-connecting body provided with a plurality of conductive connection elements. In the case of connecting two electronic devices together by the use of an electrically-connecting body, the connection elements with which the electrically-connecting body is provided have to be held to have a predetermined interval (pitch) by an insulator lest the terminals disposed on the area alley of each of the electronic devices should mutually cause short circuit.

As methods of forming an insulator in an electrically-connecting body and methods of fixing a connection element, there have conventionally been known a method where an insulator (carrier) provided with holes for housing the desired number of connection elements is manufactured by injection forming by the use of plastic having an insulation property to insert the connection elements in the holes (see Japanese Patent No. 3753615 and Japanese Patent No. 3860561), a method where holes are arranged in a plastic sheet having an insulation property with a puncher or the like by the use of a die to bond the plastic sheet to the connection elements by means of an adhesive such as an adhesive sheet (see Japanese Patent No. 3847227 and Japanese Patent No. 3703748), and a method where silicon rubber is stuck on glass fiber fabric or the like having no conductivity by overmolding or lamination, and then the connection elements are inserted with a special tool for exclusive use, or the connection elements are inserted in the holes which are made with a die such as a punch, a blade, a laser, or the like, followed by connecting the connection elements with fibers of the fabric (see Japanese Patent No. 4102196).

In the method disclosed in the Japanese Patent No. 3753615 and Japanese Patent No. 3860561, in the case of manufacturing an insulator (carrier) of an electrically-connecting body responding to electronic devices where miniaturization of the terminal and narrowing of the pitch proceed, a mixture of about 60% of glass fibers with a resin such as PPS or LCP is generally used as a material for forming. However, a die required for injection forming of the material has to have a hot runner structure to have small-sized parts, and the manufacturing employs a material having excellent high temperature strength. Therefore, the initial costs are high. In addition, in this method, an injection forming machine capable of thin high-speed filling is used, and it is necessary to keep the temperature of the die relatively high in the process of injection forming. Therefore, the running cost is high. Further, the initial cost for, for example, the tool for exclusive use used in the step of inserting the connection elements into the holes for the connection elements provided in the carrier is not low.

Furthermore, in a test socket which is required to increase the speed, it is generally hoped that the entire length of the connection element is as short as possible. However, in order to manufacture a formed article having high density (narrow pitch) and small height (thin type) by injection molding, high techniques and a more expensive die are required which raises the costs more.

On the other hand, since the method disclosed in the Japanese Patent No. 3847227 and Japanese Patent No. 3703748 employs a sheet for the insulator, the method is easier than the method disclosed in the Japanese Patent No. 3753615 and Japanese Patent No. 3860561 regarding the manufacturing of an article having small height. However, hole-making is necessary for two kinds of materials for the sheet functioning as the insulator and the adhesive (adhesive sheet or the like). In particular, for the adhesive in this case, a thermosetting resin of an epoxy type, an imide type, or the like is often used as the adhesive material. Since holes are made to such a material by holding the material, which is relatively soft in a half-hardened state, between cover films, the shape of the hole is easily destroyed. In addition, it has a cost problem in that the life span of the die used for the hole-making becomes short. In addition, in the case of making holes in the sheet with a narrow pitch in order to respond to electronic devices where miniaturization of the terminal and narrowing of the pitch proceed, it is difficult to make holes by the use of a die. That is, in the case of making holes in a sheet with a die, the narrower the width of a sheet portion remaining between the holes to be made (remaining portion width) is, the more difficult the hole-making is. It is difficult to respond to a narrow pitch with the remaining portion width of smaller than 0.15 mm. Further, in order to bond a thin sheet with connection elements with no positional deviation, a jig and advanced techniques are required, and strength (tension) of the sheet itself has to be considered.

Also, in the method disclosed in the Japanese Patent No. 4102196, the connection elements are inserted one by one in the holes made in fabric subjected to the reinforcing and insulating treatments to cause high costs. In addition, there arise a problem of causing a position of deviation upon insertion of the connection elements by the influence of the thickness and rigidity of the fibers of the fabric and a problem of unstable posture (contact point upon being brought into contact with the terminal of the electronic device) of the connection elements. Further, since hole-making by a laser causes transformation (smear) in the periphery of the hole due to the processing heat, like the hole-making using a die, it is difficult to respond to a narrow pitch with the small remaining portion width.

SUMMARY OF THE INVENTION

The present invention has been made in view of the conventional situation and mainly aims to provide an electrically-connecting body which can be manufactured at low costs in comparison with a conventional one and where holes can be made easily with a narrow pitch with the remaining portion width of smaller than 0.15 mm and a manufacturing method thereof.

The present inventors focused on the fact that screen printing can exhaustively reproduce a fine and complex flat surface shape and found out that the aforementioned aim can be achieved by using it for forming of the insulator in an electrically-connecting body, which led to the completion of the present invention. That is, according to the present invention, there are provided the following film-shaped electrically-connecting body and method for manufacturing the film-shaped electrically-connecting body.

[1] A film-shaped electrically-connecting body which is used for electrically connecting a plurality of electronic devices and which comprises: two insulation sheets having a plurality of opening portions formed therein at a regular interval and having electrical insulation and elasticity, and a plurality of plate-shaped connection elements having conductivity and elasticity; a part of each of the connection elements being held between the two insulation sheets, the other part where the connection element is not held being extended from the portion held to the opening portion and bent to form a contact point with a terminal of the electric device, and the two insulation sheets being unified at a portion where the connection element is not present therebetween; wherein the two insulation sheets are formed by screen printing using a material having electrical insulation and elasticity and being dissolved in a solvent as an ink for printing.

[2] The film-shaped electrically-connecting body according to [1], wherein the insulation sheet is formed of at least one material selected from the group consisting of polyimide and silicon elastomer.

[3] The film-shaped electrically-connecting body according to [1] or [2], wherein the connection element is formed of at least one material selected from the group consisting of beryllium copper, nickel beryllium, titanium copper, and phosphor bronze.

[4] The film-shaped electrically-connecting body according to any one of [1] to [3], wherein the electric device is at least one kind selected from the group consisting of an integrated circuit, an electronic part, a cable, a substrate, a connector, a microphone, a motor, an antenna, and a speaker.

[5] A method for manufacturing a film-shaped electrically-connecting body which is used for electrically connecting a plurality of electronic devices and which comprises two insulation sheets having a plurality of opening portions formed therein at a regular interval and having electrical insulation and elasticity, and a plurality of plate-shaped connection elements having conductivity and elasticity; a part of each of the connection elements being held between the two insulation sheets, the other part where the connection element is not held being extended from the portion held to the opening portion and bent to form a contact point with a terminal of the electric device, and the two insulation sheets being film-shaped electrically connecting bodies unified at a portion where the connection element is not present therebetween; the method comprising:

(A) a step of manufacturing a first insulation sheet-conductive sheet complex by forming the first insulation sheet having a plurality of opening portions formed therein at a regular interval on one surface of a conductive sheet having conductivity and elasticity by screen printing performed at least once using a material having electrical insulation and elasticity and being dissolved in a solvent as an ink for printing, and drying and hardening the first insulation sheet, (B) a step of manufacturing a first sheet-connection element complex by removing the portion other than the portion functioning as the connection element from the conductive sheet constituting the first insulation sheet-conductive sheet complex manufactured in the step (A) by etching, (C) a step of manufacturing a first insulation sheet-connection element-second insulation sheet complex by forming the second insulation sheet having opening portions having the same shape and size and formed at the same positions as in the opening portions of the first insulation sheet on the surface where the connection elements of the first insulation sheet constituting the first insulation sheet-connection element complex manufactured in the step (B) are present of the first insulation sheet by screen printing performed at least once using the same ink as the ink used in the step (A), and drying and hardening the second insulation sheet, (D) a step of subjecting the portion extended to the opening portion of each of the connection element constituting the first insulation sheet-connection element-second insulation sheet complex manufactured in the step (C) to bending to form a contact point with a terminal of the electric device (first manufacturing method).

[6] A method for manufacturing a film-shaped electrically-connecting body which electrically connects a plurality of electronic devices and which comprises two insulation sheets having a plurality of opening portions formed therein at a regular interval and having electrical insulation and elasticity, and a plurality of plate-shaped connection elements having conductivity and elasticity; a part of each of the connection elements being held between the two insulation sheet, the other part where the connection element is not held being extended from the portion held to the opening portion and bent to form a contact point with a terminal of the electronic device, and the two insulation sheets being film-shaped electrically-connecting bodies unified at a portion where the connection element is not present therebetween; the method comprising:

(a) a step of manufacturing a connection element sheet where a plurality of connection elements aligned at a regular interval in a flat surface direction are unitarily bonded by bridges connecting the connection elements with working the conductive sheet having conductivity and elasticity, (b) a step of forming the first insulation sheet having a plurality of openings formed therein at a regular intervals on a pedestal sheet having a flat surface by screen printing performed at least once using a material having electrical insulation and elasticity and being dissolved in a solvent as an ink for printing, (c) a step of forming a second insulation sheet having openings having the same shape and size and formed at the same positions as in the opening portions of the first insulation sheet when the second insulation sheet is superimposed on the first insulation sheet on the pedestal sheet having a flat surface by screen printing performed at least once using the same ink as the ink used in the step (b), (d) a step of manufacturing a laminate of the first insulation sheet, the connection element sheet, and the second insulation sheet by superimposing the connection element sheet manufactured in the step (a) on the first insulating sheet and then superimposing the second insulation sheet on the connection element sheet on the surface opposite to the surface in contact with the first insulation sheet at the time of half-hardened state before the ink in the surface layer portion of each of the first insulation sheet formed in the step (b) and the second insulation sheet formed in the step (c) is completely dried, (e) a step of completely drying and hardening the ink of the first insulation sheet and the second insulation sheet by, after peeling the pedestal sheet used upon screen printing of each of the first insulation sheet and the second insulation sheet from the laminate manufactured in the step (d), the laminate is subjected to a heat treatment, and (f) a step of bending the portion being extended to the opening portion of each of the connection elements to form a contact point with a terminal of the electronic device with separating the connection elements from one another by removing the bridges of the connection element sheet constituting the laminate after the ink is completely dried and hardened in the step (e) (second manufacturing method).

[7] The method for manufacturing a film-shaped electrically-connecting body according to [5] or [6], which includes a step of plating the connection elements.

According to the present invention, hole-making is not required in the forming of the insulation sheet having a large number of opening portions (holes), and the insulation sheet having opening portions formed from the beginning can be obtained as a printed piece by screen printing. Therefore, a die or the like for the hole-making is not required, and generation of material waste due to the hole-making can be suppressed. For example, in the case of manufacturing an insulation sheet having rectangular opening portions each having a long side of 1 mm and a short side of 0.5 mm and arranged with a pitch of 1 mm, the area of the opening portions is the same as the area of the portions (substantive portions) other than the opening portions. Therefore, in the forming of the opening portions by the hole-making using a die or the like, half of the material is discarded as the waste. However, by manufacturing the insulation sheet having opening portions formed from the beginning by screen printing, such a large amount of material waste is not generated. Therefore, it is excellent from the viewpoint of resource protection as well as being able to be manufactured at low costs.

In addition, in materials produced in a relatively large amount such as a sheet or fabric which has conventionally been used for an insulator, the thickness is standardized, and therefore the degree of freedom in design is low, for example, design of an insulator having a thickness different from the standardized article is hard. However, in the case of forming an insulation sheet by screen printing as in the present invention, it is possible to flexibly respond to changes in the thickness of the insulation sheet and the flat surface shape of the opening portions by adjustment or the like of the printing conditions, and therefore the degree of freedom in design is high.

In addition, in the case of forming the insulator by injection forming, an expensive die and an injection-forming machine capable of thin high-speed filling are required for forming an insulator having a fine and complex shape, and the productivity is deteriorated. However, in the case of forming the insulation sheet by screen printing, even an insulator having a fine and complex shape can be manufactured by preparing one or a plurality of screens, which is by far lower in cost than a die. Therefore, it is advantageous in both the cost and productivity aspects.

Further, in the insulation sheet formed by screen printing is bonded to and unified with the connection elements by the drying and hardening of the ink. Therefore, the insulation sheet can be unified with the connection elements without using a sub-material such as an adhesive, and a step of attaching the connection elements to the insulator one by one is not required.

Furthermore, in the hole-making in the insulator by a die or a laser, it is difficult to form holes with a narrow pitch with a remaining portion width of smaller than 0.15 mm. However, in the case of forming an insulation sheet by screen printing as in the present invention, it is also possible to provide opening portions with a narrow pitch with a remaining portion width of about 50 μm, and therefore an electrically-connecting body having a narrow pitch and a small height can easily be obtained.

REFERENCE NUMERALS

1: film-shaped electrically-connecting body, 3a: insulation sheet, 3b: insulation sheet, 5: connection element, 5a: other part of connection element not held between two insulating sheets, 5b: part of connection element held between two insulating sheets, 7: opening portion, 7a: opening portion, 7b opening portion, 11: contact point, 13: contact point, 15: conductive sheet, 17: first insulation sheet, 19: first insulation sheet-conductive sheet complex, 21: first insulation sheet-connection element complex, 23: second insulation sheet, 25: first insulation sheet-connection element-second insulation sheet complex, 27: bridge, 29: connection element sheet, 31: pedestal sheet, 33: first insulation sheet, 33a: first printed layer, 33b: second printed layer, 33c: third printed layer, 35: pedestal sheet, 37: second insulation sheet, 37a: first printed layer, 37b: second printed layer, 37c: third printed layer, 39: laminate, 51: electronic device, 53: terminal, 61: electronic device, 63: terminal

DETAILED DESCRIPTION OF THE INVENTION

Hereinbelow, the present invention will be described on the basis of a specific embodiment. However, the present invention should not be construed by limiting to the embodiment, and various changes, modifications, improvements may be made on the basis of knowledge of a person of ordinary skill in the art as long as they do not deviate from the range of the present invention.

Figure 1:
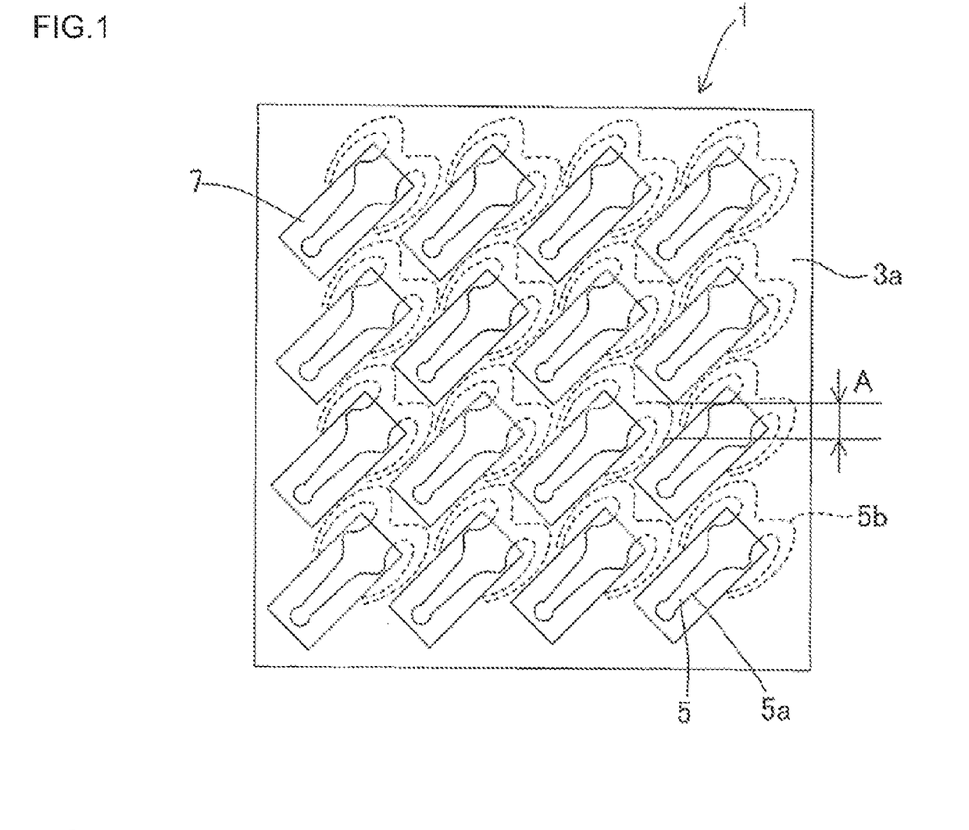
FIG. 1 is a plan view showing an example of an embodiment of a film-shaped electrically-connecting body of the present invention.
Figure 2:
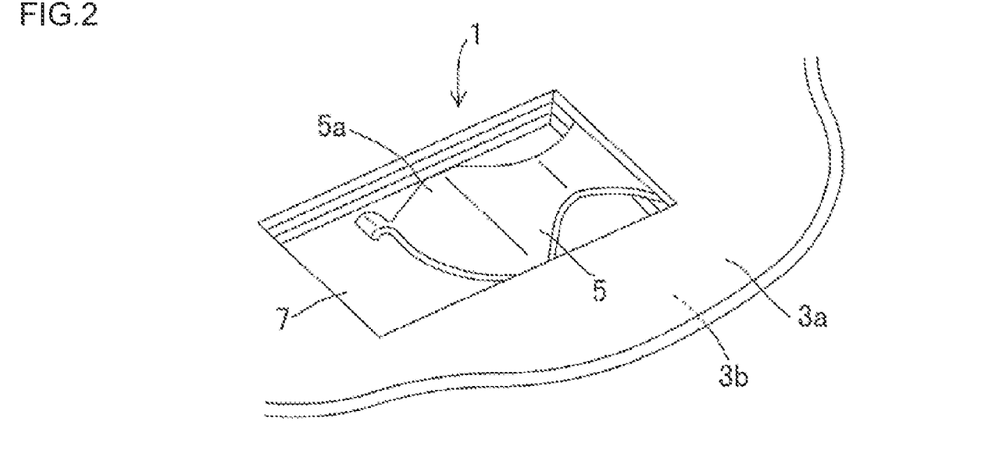
FIG. 2 is a partial perspective view showing an example of an embodiment of a film-shaped electrically-connecting body of the present invention.
Figure 3:
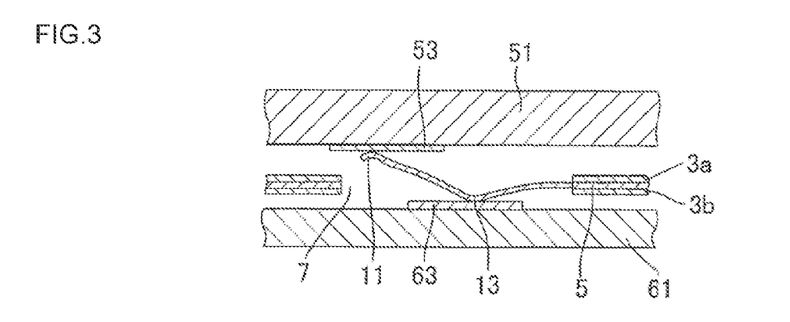
FIG. 3 is a partial cross-sectional view showing an embodiment of specific use of a film-shaped electrically-connecting body of the present invention.

FIG. 1 is a plan view showing an example of an embodiment of a film-shaped electrically-connecting body of the present invention, FIG. 2 is a partial perspective view showing an example of an embodiment of a film-shaped electrically-connecting body of the present invention, and FIG. 3 is a partial cross-sectional view schematically showing an embodiment of specific use of a film-shaped electrically-connecting body of the present invention.

A film-shaped electrically-connecting body 1 of the present invention is used for electrically connecting a plurality of electronic devices 51 and 61 together and provided with two insulation sheets 3a and 3b having a plurality of opening portions 7 formed therein at a regular interval and having electrical insulation and elasticity and a plurality of plate-shaped connection elements 5 having conductivity and elasticity. A part 5b of each of the connection elements 5 is held between the two insulation sheets 3a and 3b, and the other part 5a where the connection element is not held is extended from the part 5b held to the opening portion 7 and bent to form contact points 11 and 13 with terminals 53 and 63 of the electric devices 51 and 61, and the two insulation sheets 3a and 3b are unified at a portion where the connection element is not present therebetween.

A film-shaped electrically-connecting body 1 of the present invention has such a basic structure, and, as the characteristic structure, the two insulation sheets 3a and 3b are formed by screen printing using a material having electrical insulation and elasticity and being dissolved in a solvent as an ink for printing.

By employing screen printing, hole-making is not required for forming the insulation sheets 3a and 3b having a plurality of opening portions (holes) 7, and an insulation sheet having openings formed from the beginning can be obtained as a printed piece. Therefore, a die, laser installation, and the like for hole-making are not necessary, and generation of material waste due to the hole-making can be suppressed. For example, in the case of manufacturing insulation sheets 3a and 3b each having rectangular opening portions 7 each having a long side of 1 mm and a short side of 0.5 mm and arranged with a pitch of 1 mm, the area of the opening portions 7 is the same as the area of the portions (substantive portions) other than the opening portions 7. Therefore, in the forming of the opening portions by the hole-making using a die or the like, half of the material is discarded as the waste. However, by manufacturing the insulation sheets 3a and 3b each having opening portions formed from the beginning by screen printing, such a large amount of material waste is not generated. Therefore, it is excellent from the viewpoint of resource protection as well as being able to be manufactured at low costs.

In addition, in materials produced in a relatively large amount such as a sheet or fabric which has conventionally been used for an insulator, the thickness is standardized, and therefore the degree of freedom in design is low, for example, design of an insulator having a thickness different from the standardized article is hard. However, in the case of forming an insulation sheet by screen printing as in the present invention, it is possible to flexibly respond to changes in the thickness of the insulation sheet and the flat surface shape of the opening portions by selection of screen mesh to be used, adjustment of the printing conditions, or the like, and therefore the degree of freedom in design is high. For example, the thickness can be adjusted depending on the viscosity of the ink, the number of the printing, and the like. In addition, by changing the screen mesh, manufacturing becomes easy from the sheet having opening portions 7 whose flat surface shape is quadrangular as in FIG. 1 to the sheet having opening portions 7 whose flat surface shape is irregular as in FIG. 4.

In addition, in the case of forming an insulator by injection forming, an expensive die and an injection-forming machine capable of thin high-speed filling are required for forming an insulator having a fine and complex shape, and the productivity is deteriorated. However, in the case of forming the insulation sheet by screen printing, even an insulator having a fine and complex shape can be manufactured by preparing one or a plurality of screens, which is by far lower in cost than a die. Therefore, it is advantageous in both the cost and productivity aspects.

Figure 4:
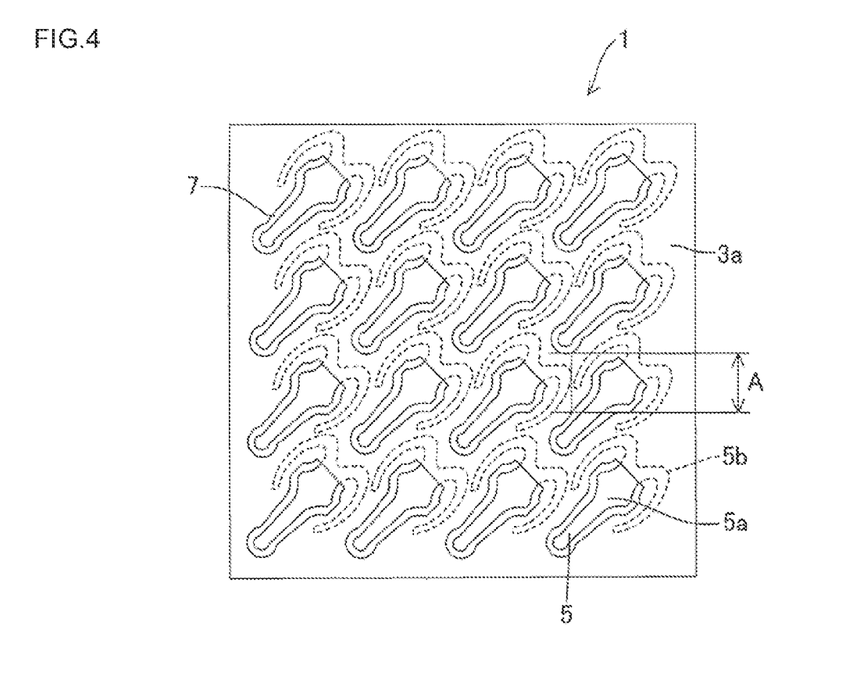
FIG. 4 is a plan view showing another example of an embodiment of a film-shaped electrically-connecting body of the present invention.

In the connection of the electric devices by the uses a film-shaped electrically-connecting body of the present invention, after the film-shaped electrically-connecting body 1 is inserted between an electronic device 51 on one side and another electronic device 61 on the other side in FIG. 3, the gap between the devices is narrowed, and thereby the connection element 5 is pressed by the terminals 53 and 63 due to elasticity of the connection element 5 bent to have a predetermined shape to cause electric conduction. At that time, by the contact force with the contact point 11 of the contact element 5 as the point of load and the contact point 13 as the fulcrum, the portion where the connection element 5, the insulation sheet 3a, and the insulation sheet 3b overlap is lifted up. Since shearing stress acts on the material portions (substantive portions other than the opening portions) of the insulation sheets 3a and 3b due to the elasticity of the mutually adjacent connection elements 5, fracture may be caused in a material portion, or poor contact may be caused by a deviation in the disposition site or strain of the connection element 5 due to deformation of a material portion. For example, in the case of a quadrangular opening portion 7 as in FIG. 1, depending on the disposition interval, the width A in the material portion is too small, thereby easily causing fracture or poor contact. In order to avoid such trouble, as shown in FIG. 4, it is effective to change the shape of the opening portions 7 into an irregular shape to increase the width A of the material portion. However, if such opening portions having an irregular shape are formed by the use of a die as in a conventional manner, costs for the die increase. Further, in the case that the shape of the opening portions 7 is designed to be a shape obtained by just off-setting the connection element (shape along the outer shape of the connection element) so that the opening area of the opening portions 7 is minimized, the shape of the die-side blade portion of the irregular shape has increased unevenness to cause concentration of stress. Therefore, the life span of the die becomes short. By employing screen printing as the present invention, even opening portions having an irregular shape other than a quadrangular shape can easily be arranged by the use of inexpensive screen mesh.

In addition, in the insulation sheet formed by screen printing is bonded to and unified with the connection elements by the drying and hardening of the ink. Therefore, the insulation sheet can be unified with the connection elements without using a sub-material such as an adhesive, and a step of attaching the connection elements to the insulator one by one is not required.

Figure 15:
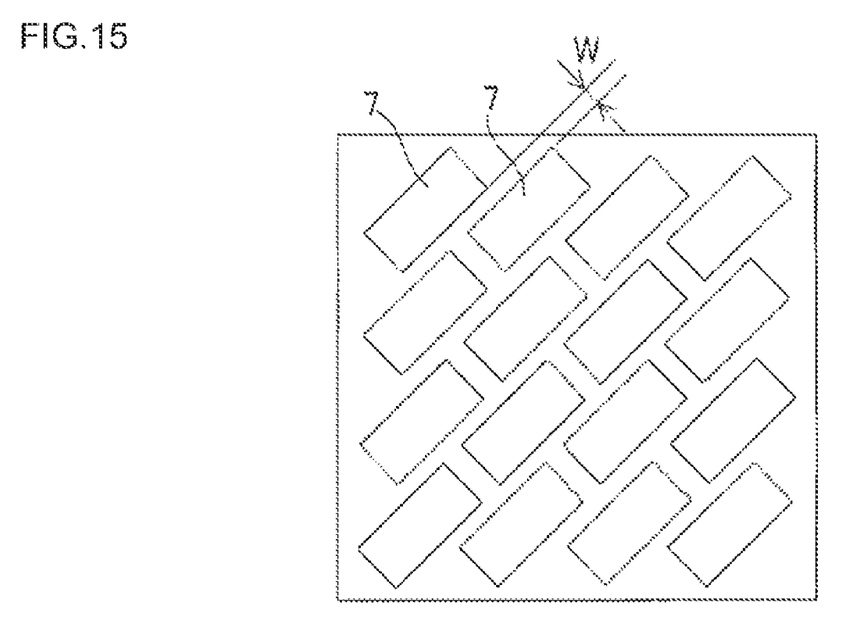
FIG. 15 is a plan view showing a remaining portion width of an insulation sheet.

Furthermore, in the hole-making in the insulator by a die or a laser, it was the limit of narrowing the pitch to have a remaining portion width W of about 0.15 mm between the opening portions 7 and 7 shown in FIG. 15. However, in the case of forming an insulation sheet having opening portions by screen printing, it is also possible to narrow the remaining portion width W down to about 50 μm.

There is no particular limitation on the material for the connection element used for a film-shaped electrically-connecting body of the present invention as long as it has conductivity and elasticity, and suitable examples of the material include beryllium copper, nickel beryllium, titanium copper, and phosphor bronze.

The thickness of the connection element is preferably 0.01 to 0.10 mm, and more preferably 0.02 to 0.05 mm. When it is smaller than 0.01 mm, since strength is too low, it may be difficult to obtain adequate contact load with respect to the terminal of the electronic device. When it is larger than 0.1 mm, since strength is too high, it may be difficult to secure a displacement amount sufficient for pressing the connection element with the terminal of the electronic device on one side of the film-shaped electrically-connecting body against the terminal of another electronic device on the opposite side, and therefore it may be difficult to secure stable connection.

The material constituting the insulation sheet should have electrical insulation and elasticity and be able to form the sheet by screen printing. Such materials are present widely from engineering plastics such as polyimide, silicon elastomer, epoxy resin, and rubber to natural materials. However, polyimide and silicon elastomer are suitable from the viewpoints of elasticity maintenance (flexibility) from low temperature to high temperature and strength.

A film-shaped electrically-connecting body of the present invention can suitably be used as a socket or a contact board in the case of electrically connecting an electronic device provided with a spherical terminal or a flat surface type terminal together (e.g., the case of mounting an integrated circuit on the substrate). More specifically, it can suitably be used when another electronic devices, for example, an integrated circuit, an electronic part, a cable, a substrate, a connector, a microphone, a motor, an antenna, a speaker, or the like is mounted on an electronic device provided with a spherical terminal or a flat surface type terminal, for example, a mounting substrate and substrates for various tests.

Hereinbelow, methods for manufacturing a film-shaped electrically-connecting body of the present invention (the first manufacturing method and the second manufacturing method) will be described.

The first manufacturing method includes the following steps (A) to (D).

Figure 5:
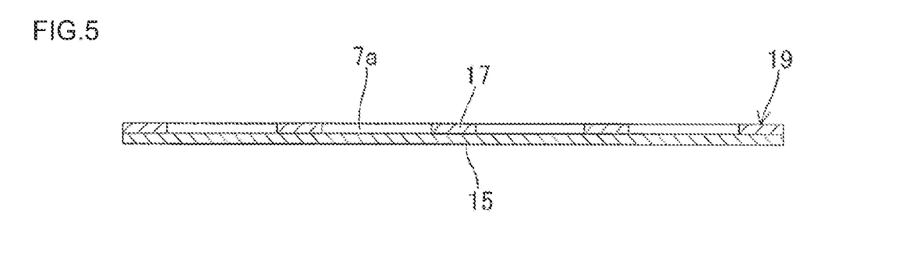
FIG. 5 is a schematic cross-sectional view of the first insulation sheet-conductive sheet complex manufactured in the step (A) of the first manufacturing method.

Step (A):

In this step, a material having electrical insulation and elasticity and being dissolved in a solvent is used as an ink for printing. As shown in FIG. 5, on a surface of a conductive sheet 15 having conductivity and elasticity, the first insulation sheet 17 having a plurality of opening portions 7a formed at a regular interval is formed by screen printing performed at least once, followed by drying and hardening to manufacture the first insulation sheet-conductive sheet complex 19.

Suitable examples of the material constituting the conductive sheet 15 and having conductivity and elasticity include beryllium copper, nickel beryllium, titanium copper, and phosphor bronze. In addition, as the material having electrical insulation and conductivity and used for a constituent material for the ink, there may suitably be used polyimide or silicon elastomer. As the solvent, triethyleneglycol dimethyl ether can suitably be used. It is preferable to use ink having solid of about 20 to 35 mass % and a viscosity of about 50 to 200 Pa·s. The screen printing plate (screen mesh) used for the screen printing preferably has a gauze thickness of 30 to 100 μm, an emulsion thickness of 15 to 100 μm, a gauze wire diameter of 15 to 40 μm. The number of the screen printing may be one or several until a predetermined thickness can be obtained. The first insulation sheet 17 printed and formed on the conductive sheet 15 is preferably dried in a temperature atmosphere of about 50° C.

The flat surface shape of the opening portions 7a of the first insulation sheet 17 printed may be quadrangular as shown in FIG. 1 or irregular as shown in FIG. 4. In addition, there is no particular limitation on the disposition interval (pitch) of the opening portions 7a, and the remaining portion width between the opening portions may be narrowed down to about 50 μm.

Figure 6:
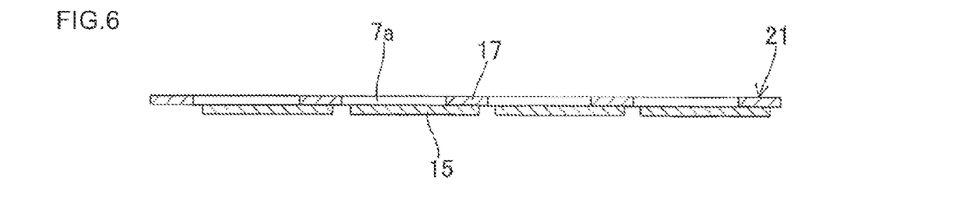
FIG. 6 is a schematic cross-sectional view of the first insulation sheet-connection element complex manufactured in the step (B) of the first manufacturing method.

Step (B):

In this step, the portion other than the portion functioning as connection element is removed by etching from the conductive sheet 15 constituting the first insulation sheet-conductive sheet complex 19 manufactured in the step (A) to manufacture the first insulation sheet-connection element complex 21 composed of the first insulation sheet 17 and the connection element 5 as shown in FIG. 6.

That is, etching is performed by forming an etching resist film in a portion functioning as connection element of the surface where the first insulation sheet 17 is not printed of the conductive sheet 15 in the first insulation sheet-conductive sheet complex 19 to remove the portion other than the portion functioning as the connection elements to obtain a complex where only the portions functioning as the connection elements 5 are unified with the first insulation sheet 17. For the forming of the etching resist film, there may be employed a film-forming method by general photo resist or screen printing in the same manner as the forming of the insulation sheet. In addition, as the order of the steps, the insulation sheet may be formed after the forming of the etching resist. It enables to form a more exhaustive shape of the connection element 5 by forming a resist also on the insulation sheet side in advance.

Figures 7, 8:
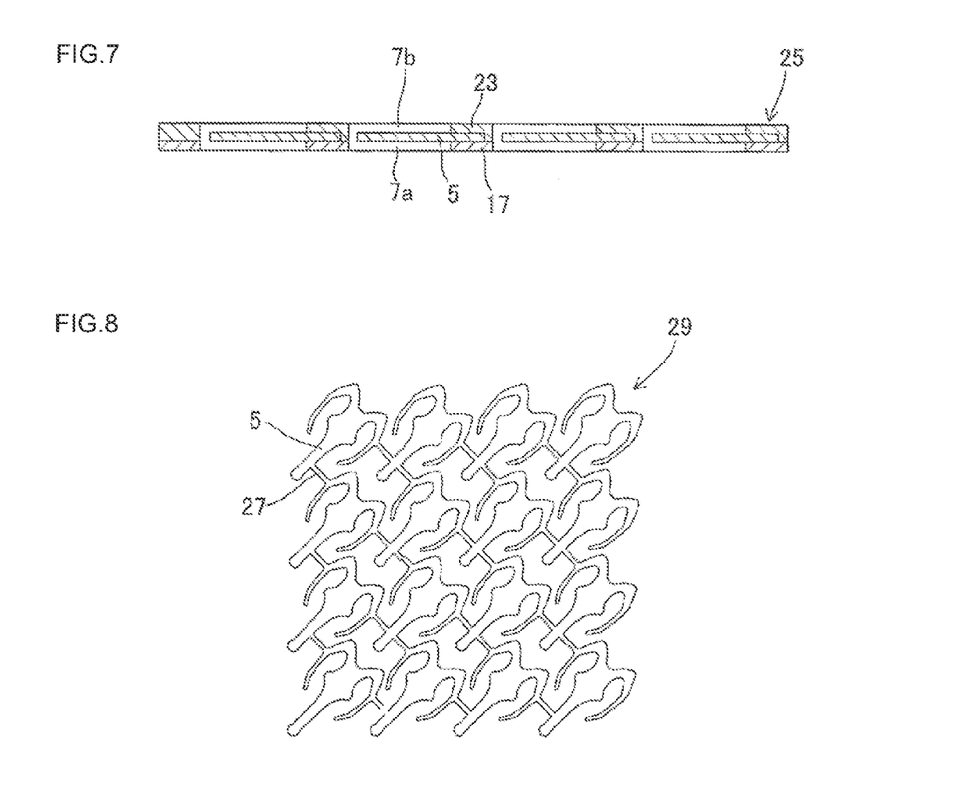
FIG. 7 is a schematic cross-sectional view of the first insulation sheet-connection element-second insulation sheet complex manufactured in the step (C) of the first manufacturing method.
FIG. 8 is a plan view of a connection element sheet manufactured in the step (a) of the second manufacturing method.

Step (C):

In this step, on the surface where the connection element 5 is present of the first insulation sheet 17 constituting the first insulation sheet-connection element complex 21 manufactured in the step (B), the second insulation sheet 23 having opening portions 7b having the same shape and size and formed at the same positions as in the opening portions 7a of the first insulation sheet 17 is formed by screen printing performed at least once using the same ink as the ink used in the step (A), and then the second insulation sheet 23 is dried and hardened to manufacture the first insulation sheet-connection element-second insulation sheet complex 25 composed of the first insulation sheet 17, the connection element 5, and the second insulation sheet 23 as shown in FIG. 7.

Preferable specifications of the screen mesh used for the screen printing of the second insulation sheet 23 are the same as the screen mesh used for the screen printing of the first insulation sheet 17 in the step (A). In addition, like the screen printing of the first insulation sheet 17, also in the screen printing of the second insulation sheet 23, the number of the screen printing may be one or several until a predetermined thickness can be obtained. The second insulation sheet 23 printed and formed above is preferably dried in a temperature atmosphere of about 50° C. The second insulation sheet 23 is bonded with the connection element 5 by the drying and hardening of the ink and unified with the first insulation sheet 17 in the portions where the connection elements 5 are not present between them.

Step (D):

In this step, the portion extended to the opening portion of each of the connection element constituting the first insulation sheet-connection element-second insulation sheet complex 25 manufactured in the step (C) is subjected to bending to form contact points 11 and 13 with terminals 53 and 63 of the electronic devices 51 and 61 as in FIG. 3. The bending can be performed by press working or the like.

Incidentally, the first manufacturing method may include a step of plating the connection elements as necessary. This step is preferably performed before or after any of the steps after etching of the step (B), for example, before or after the screen printing of the second insulation sheet in the step (C) or after the bending process in the step (D).

The second manufacturing method included the following steps (a) to (f).

Step (a):

In this step, the conductive sheet having conductivity and elasticity is worked to manufacture a connection element sheet 29 where a plurality of connection elements aligned at a regular interval in a flat surface direction as shown in FIG. 8 are unitarily bonded by bridges 27 connecting the connection elements.

As a method for manufacturing a connection element sheet from the conductive sheet, etching or press working is suitable. That is, the connection element sheet 29 is obtained by performing etching by forming an etching resist film corresponding with the whole shape of the connection element sheet on the surface of the conductive sheet to remove the portion other than the portion functioning as the connection element sheet 29 or by punching the portion functioning as the connection element sheet 29 out of the conductive sheet by the press working.

Suitable examples of the material constituting the conductive sheet and having conductivity and elasticity include beryllium copper, nickel beryllium, titanium copper, and phosphor bronze. In addition, the connection element sheet of FIG. 8 has 16 (4×4) connection elements 5 disposed therein. However, in the present manufacturing method, the number of the connection elements 5 in the connection element sheet 29 is arbitrary, and the disposition interval (pitch) of the connection elements 5 is arbitrary. Since the bridges 27 connecting the connection elements 5 are cut off finally, they are arranged in the positions where at least a part is shown out of the opening portion of the insulation sheet when the sheet is superimposed on the insulation sheet in the step described later.

Step (b):

In this step, the first insulation sheet having a plurality of openings formed therein at a regular interval is formed on a pedestal sheet having a flat surface by screen printing performed at least once using a material having electrical insulation and elasticity and being dissolved in a solvent as an ink for printing.

As the material constituting the ink and having electric insulation and elasticity, polyimide or silicon elastomer can suitably be used. As the solvent, triethyleneglycoldimetyl ether or the like can suitably be used. Ink having solid of about 20 to 35 mass % and a viscosity of about 50 to 200 Pa·s is preferably used. As the pedestal sheet where the first insulation sheet is printed, there is preferably used a sheet material made of PET (polyethylene telephthalate) or stainless steel having a thickness of 0.15 mm or more and having a coating treatment (release treatment) with silicon, teflon, or the like on the surface (printing surface) so that the first insulation sheet can easily be peeled off from the pedestal sheet in a step described later.

Since the sheet material made of PET (PET sheet) among the sheet materials may be deformed by the repeated drying treatment with heating, it is inferior to the stainless-steel sheet material (stainless sheet) in durability in the case of repeated use. However, since a PET film available in the market in the state that the release treatment is performed in advance can be used as it is, it is advantageous in that the release treatment can be omitted. On the other hand, since a stainless sheet having a release treatment performed thereon in advance is not in the market, it is necessary to perform the release treatment by coating with teflon or the like. However, since it does not deform by the repeated drying treatment with heating, it is superior to the PET sheet in durability in the case of repeated use. In addition, in the case that the first insulation sheet is thick, and thereby the increase of the peeling force upon peeling the sheet from the pedestal sheet is expected, use of the stainless sheet having higher strength than the PET sheet as the pedestal sheet can manufacture a film-shaped electrically-connecting body with higher yield.

Incidentally, also in the case of using a sheet of either of the materials as the pedestal sheet, the release performance imparted by the release treatment gradually deteriorates as the use is repeated, and, finally, the first insulation sheet after the drying and hardening cannot be peeled off from the pedestal sheet. In addition, as the use is repeated, a flaw (e.g., scratch) is generated on the surface of the sheet, which may make the peeling of the first insulation sheet from the pedestal sheet hard, or which may cause deformation of the cross-sectional shape of the first insulation sheet by the transcription of the flaw on the surface of the pedestal sheet to the first insulation sheet. Therefore, in order to stably manufacture a film-shaped electrically-connecting body by the present manufacturing method, it is necessary to adequately manage the life span of the pedestal sheet.

As the preferable specifications of the screen printing plate (screen mesh) used for screen printing, it is preferable to have a gauze thickness of 30 to 100 μm, an emulsion thickness of 15 to 100 μm, and a gauze line diameter of 15 to 40 μm. The number of screen printing may be one or several until a predetermined thickness is obtained. When the screen printing is performed several times, it is preferable to dry the printed layer for every printing except for the last printing (printing of the outermost layer). Though it is also possible to print in layers without drying, the solvent in the ink penetrates the layer printed earlier, and the shape of the layer printed earlier may be damaged by the external force due to contact of the screen mesh, squeegee, or the like upon the following printing, which is not preferable. In addition, when the screen printing is performed several times, it is preferable that the printing machine is provided with a positioning structure such as a difference in level with being engaged with a part of the pedestal sheet to position the pedestal sheet lest the positional relation between the screen mesh and the pedestal sheet should be changed for every printing.

Figures 10, 11:
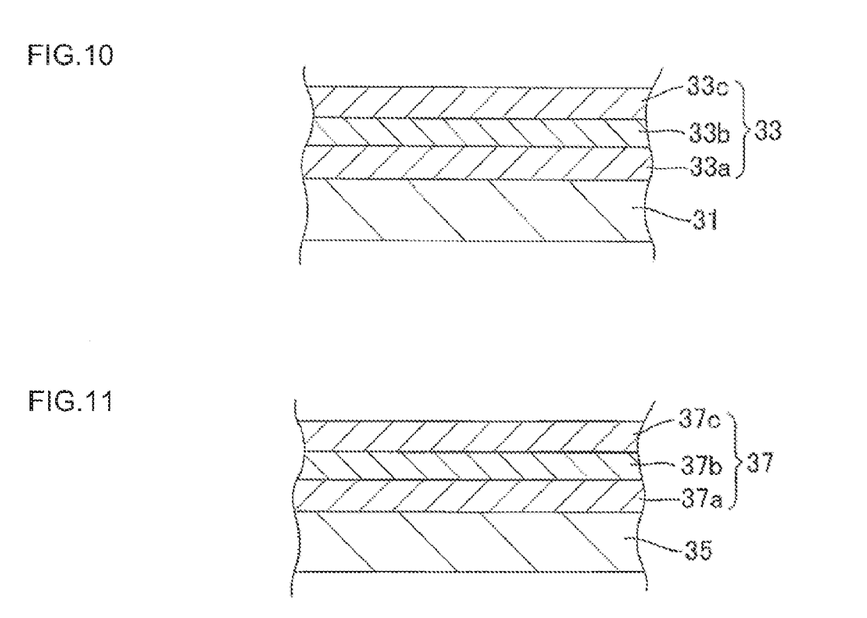
FIG. 10 is a partial schematic cross-sectional view showing an example of printing forming of the first insulation sheet in the step (b) of the second manufacturing method.
FIG. 11 is a partial schematic cross-sectional view showing an example of printing forming of the second insulation sheet in the step (c) of the second manufacturing method.

FIG. 10 shows an example of printing forming of the first insulation sheet 33 by repeating screen printing three times on the pedestal sheet 31. In this example, in the first place, the first printed layer 33*a* is formed by screen printing by the pedestal sheet 31, followed by drying at about 50° C. for 5 to 20 minutes in a temperature atmosphere. On the dried first printed layer 33*a*, the second printed layer 33*b* is formed by screen printing. Then, after drying the second printed layer 33*b* in the same manner, the third printed layer 33*c* is formed by screen printing. The third printed layer 33*c*, which is the last layer, is not completely dried and hardened to be kept in a half-hardened state where the solvent in the ink is not sufficiently volatilized. The total thickness of the first printed layer 33*a* and the second printed layer 33*b* is preferably about 25 to 35 μm. The thickness of the outermost layer is preferably about ⅓ to ⅔ of the thickness of the connection element sheet. The thickness of the outermost surface layer can be adjusted by adjusting an ink ejection amount upon performing screen printing, and it is preferable to adjust the thickness lest the ink should protrude into an opening portion even if the connection element sheet penetrates the outermost layer portion upon superimposing the connection element sheet in the step (d) described later.

The flat surface shape of the opening portion of the first insulation sheet may be quadrangular as in FIG. 1 or irregular as in FIG. 4. There is no particular limitation on the disposition interval (pitch) of the opening portion, and the remaining portion width between the opening portions may be narrowed to be about 50 μm.

Step (c):

In this step, the same ink as the ink used in the step (b) is used to form the second insulation sheet having opening portions whose shape, size, and positions coincide with those of the first insulation sheet when the second insulation sheet is superimposed on the first insulation sheet with the surfaces of them facing each other on the pedestal sheet having a flat surface by screen printing performed at least once.

The preferable specifications of the screen mesh used for the screen printing of the second insulation sheet is the same as those of the screen mesh used for the screen printing of the first insulation sheet, and the material for the pedestal sheet and the like are the same as those used for the screen printing of the first insulation sheet. In addition, like the screen printing of the first insulation sheet, in the screen printing of the second insulation sheet, the number of screen printing may be one or several until a predetermined thickness is obtained. Like the screen printing of the first insulation sheet, when the screen printing is performed several times, it is preferable to dry the printed layer for every printing except for the last printing (printing of the outermost layer).

FIG. 11 is an example of printing and forming the second insulation sheet 37 by repeating screen printing three times on the pedestal sheet 35. In this example, in the first place, the first printed layer 37a is formed by screen printing on the pedestal sheet 35, followed by drying at about 50° C. for 5 to 20 minutes in a temperature atmosphere. On the dried first printed layer 37a, the second printed layer 37b is formed by screen printing. Then, after drying the second printed layer 37b in the same manner, the third printed layer 37c is formed by screen printing. The third printed layer 37c, which is the last layer, is not completely dried and hardened to be kept in a half-hardened state where the solvent in the ink is not sufficiently volatilized. The total thickness of the first printed layer 37a and the second printed layer 37b is preferably about 25 to 35 μm. The thickness of the outermost layer is preferably about ⅓ to ⅔ of the thickness of the connection element sheet. The thickness of the outermost surface layer can be adjusted by adjusting an ink ejection amount upon performing screen printing, and it is preferable to adjust the thickness lest the ink should protrude into an opening portion even if the connection element sheet penetrates the outermost layer portion upon superimposing the connection element sheet in the step (d) described later. When the ink protrudes into the opening portion to adhere to the connection element, conduction defect may be caused.

Figure 9:
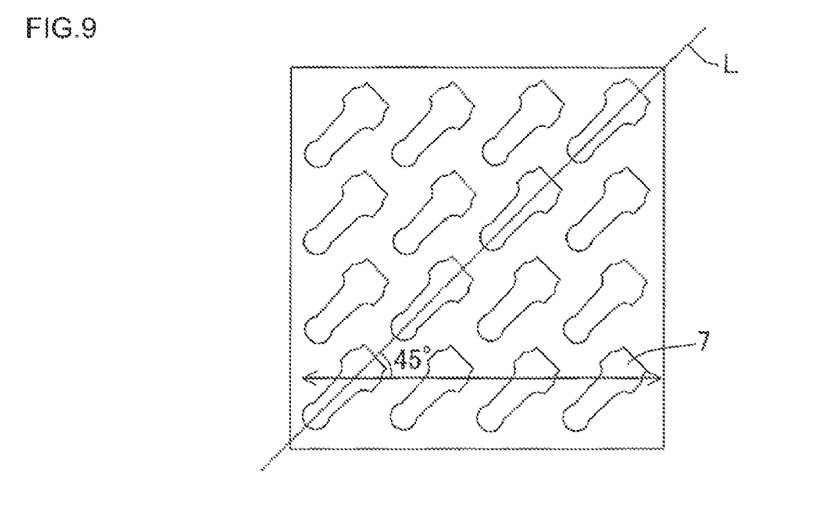
FIG. 9 is a plan view showing an example of the shape and disposition of the opening portions of the first and second insulation sheet.

As described above, it is necessary that the second insulation sheet has opening portions whose shape, size, and positions coincide with those of the opening portions of the first insulation sheet. As shown in FIG. 9, when the shape and disposition of the opening portions 7 are symmetric with respect to the straight line L forming an angle of 45° with the disposition direction of the opening portions 7 shown by arrows, the screen mesh used for the screen printing of the first insulation sheet can be used also for the screen printing of the second insulation sheet, which is economical.

Figure 12:
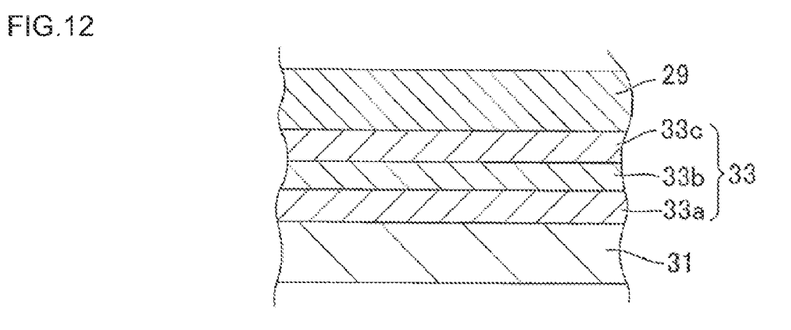
FIG. 12 is a partial schematic cross-sectional view showing the state where the connection element sheet is superimposed on the first insulation sheet in the step (d) of the second manufacturing method.
Figure 13:
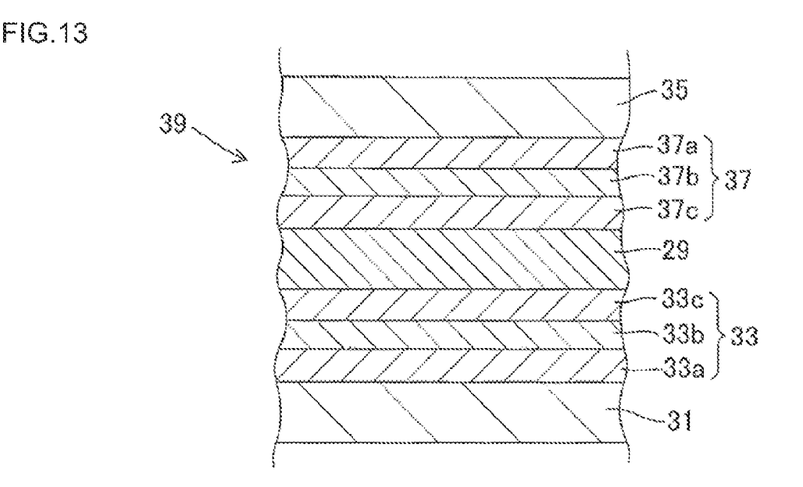
FIG. 13 is a partial schematic cross-sectional view showing the state of a laminate obtained by superimposing the connection element sheet on the first insulation sheet and superimposing the second insulation sheet on the connection element sheet in the step (d) of the second manufacturing method.

Step (d):

In this step, when the ink in the surface layer portion of the first insulation sheet formed in the step (b) and the second insulation sheet formed in the step (c) is in the half-hardened state before it is completely dried, in the first place, as shown in FIG. 12, the connection element sheet 29 manufactured in the step (a) is superimposed on the first insulation sheet 33, and then, as shown in FIG. 13, the second insulation sheet 37 is superimposed on the connection element sheet 29 on the surface opposite to the surface in contact with the first insulation sheet 33 to manufacture a laminate 39 of the first insulation sheet (including the pedestal sheet), the connection element sheet, and the second insulation sheet (including the pedestal sheet).

Upon the superimposition, the positioning is performed to give a precise positioning relation (state that apart of the connection element is protruded into the opening portion from a rim portion of the opening portion) among the positions of the opening portions of the first insulation sheet, the positions of the opening portions of the second insulation sheet and the connection elements of the connection element sheet. In order to make the positioning easy, it is preferable to make a hole for the positioning in advance in each of the first insulation sheet (including the pedestal sheet), the second insulation sheet (including the pedestal sheet), and the connection element sheet to be able to position in a proper position by passing a pin having a diameter corresponding with the holes of the sheet through the holes of the sheets.

In the case of using an adhesive for unifying the two insulation sheets and the connection elements as in a conventional manner, it is general to fill the adhesive without any gap around the connection elements or to pressurize to maintain the positional relation upon bonding. However, in the present manufacturing method, since the surface layer portions of the first insulation sheet and the second insulation sheet are in a half-hardened state before the ink is completely dried, when the connection element sheet is superimposed on these sheets, about half the thickness of the connection element sheet sinks into each of the surface layer portions of the first insulation sheet and the second insulation sheet, and the ink wraps around the connection elements, and thereby the gap between the first insulation sheet and the second insulation sheet is filled in the portion where no connection element is present therebetween. Therefore, there can be obtained a laminate where they are bonded together with high precision even without a pressure treatment.

Incidentally, in this step, the first insulation sheet 33 and the second insulation sheet 37 are superimposed in the state that they are not peeled off from the pedestal sheets 31 and 35. This is because, if the first insulation sheet and the second insulation sheet are peeled off, flatness of the first insulation sheet and the second insulation sheet is hardly maintained to make the lamination with high precision difficult.

Figure 14:
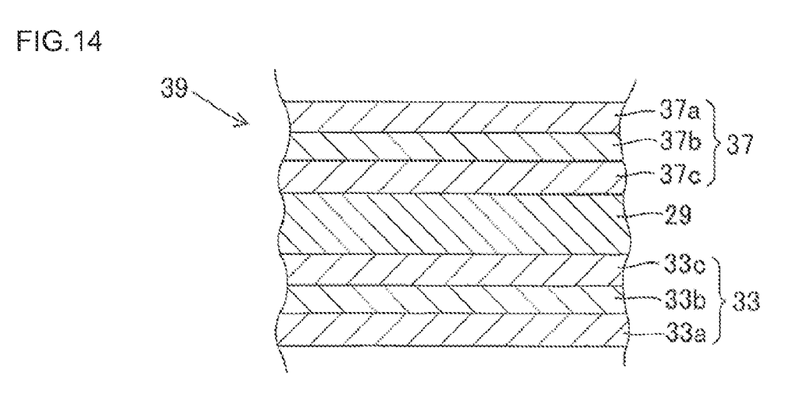
FIG. 14 is a partial schematic cross-sectional view showing a state of peeling off the pedestal sheet from the laminate in the step (e) of the second manufacturing method.

Step (e):

In this step, after peeling the pedestal sheets 31 and 35 used upon screen printing of each of the first insulation sheet 33 and the second insulation sheet 37 from the laminate 39 manufactured in the step (d), the laminate is subjected to heat treatment to completely dry and harden the ink of the first insulation sheet 33 and the second insulation sheet 37.

The drying and hardening is preferably performed by, for example, a heat treatment at 200° C. for about one hour in a drying furnace. By thus drying and hardening, the first insulation sheet 33, the connection sheet 29, and the second insulation sheet 37 constituting the laminate 39 are firmly unified.

Step (f):

In this step, after the ink is completely dried and hardened in the step (e), the bridges 27 of the connection element sheet 29 constituting the laminate 39 are removed to separate the connection elements 5 from one another, and the portion protruding into the opening portion of each of the connection elements 5 is bent to form a contact point with the terminal of the electronic device.

The bridges 27 of the connection element sheet 29 can easily be removed by performing press working or the like in the opening portions as long as the bridges are provided in such a manner that a part of each bridge is protruded from the opening portion of the insulation sheet as described above. In addition, the connection element 5 can be bent into, for example, the shape shown in FIG. 3 by the press working with a punch abutted against the connection element 5 in the opening portion.

Incidentally, the second manufacturing method may include a step of plating the connection elements as necessary. This step is preferably performed in any of the stages after manufacturing of the connection element sheet of the step (a), for example, after manufacturing the connection element sheet of step (a) or before or after the bending of the step (f).

The present invention can suitably be used as a film-shaped electrically-connecting body for electrically bonding a plurality of electronic devices.

What is claimed is:

1. A film-shaped electrically-connecting body which is used for electrically connecting a plurality of electronic devices comprising: two insulation sheets having a plurality of opening portions formed therein at a regular interval and having electrical insulation and elasticity, and a plurality of plate-shaped connection elements having conductivity and elasticity; a part of each of the connection elements being held between the two insulation sheets, the other part where the connection element is not held being extended from the portion held to the opening portion and bent to form a contact point with a terminal of the electric device, and the two insulation sheets being unified at a portion where the connection element is not present therebetween;
wherein the two insulation sheets are formed by screen printing using a material having electrical insulation and elasticity that is dissolved in a solvent and used as an ink for screen printing the two insulation sheets on a conductive sheet,
wherein the two insulation sheets are unified with the part of the plurality of connection elements held between the two insulation sheets without a layer of one of an adhesive material and a bonding material, and
wherein each of the two insulation sheets is formed of at least one material selected from the group consisting of polyimide and silicon elastomer.

2. The film-shaped electrically-connecting body according to claim 1, wherein the electric device is selected from the group consisting of an integrated circuit, an electronic part, a cable, a substrate, a connector, a microphone, a motor, an antenna, and a speaker.

3. The film-shaped electrically-connecting body according to claim 1, wherein the electric device is at least one kind selected from the group consisting of an integrated circuit, an electronic part, a cable, a substrate, a connector, a microphone, a motor, an antenna, and a speaker.

4. The film-shaped electrically-connecting body according to claim 1, wherein each of the plurality of plate-shaped connection elements is formed of at least one material selected from the group consisting of beryllium copper, nickel beryllium, titanium copper, and phosphor bronze.

5. The film-shaped electrically-connecting body according to claim 4, wherein the electric device is selected from the group consisting of an integrated circuit, an electronic part, a cable, a substrate, a connector, a microphone, a motor, an antenna, and a speaker.

6. The film-shaped electrically-connecting body according to claim 1, wherein the connection element is formed of at least one material selected from the group consisting of beryllium copper, nickel beryllium, titanium copper, and phosphor bronze.

7. The film-shaped electrically-connecting body according to claim 6, wherein the electric device is at least one kind selected from the group consisting of an integrated circuit, an electronic part, a cable, a substrate, a connector, a microphone, a motor, an antenna, and a speaker.

8. A method for manufacturing a film-shaped electrically-connecting body which is used for electrically connecting a plurality of electronic devices and which comprises two insulation sheets having a plurality of opening portions formed therein at a regular interval and having electrical insulation and elasticity, and a plurality of plate-shaped connection elements having conductivity and elasticity; a part of each of the connection elements being held between the two insulation sheets, the other part where the connection element is not held being extended from the portion held to the opening portion and bent to form a contact point with a terminal of the electric device, and the two insulation sheets being film-shaped electrically connecting bodies unified at a portion where the connection element is not present therebetween, the method comprising:
(A) a step of manufacturing a first insulation sheet-conductive sheet complex by forming the first insulation sheet having a plurality of opening portions formed therein at a regular interval on one surface of a conductive sheet having conductivity and elasticity by screen printing performed at least once using a material having electrical insulation and elasticity that is dissolved in a solvent and used as an ink for screen printing the first insulation sheet on the conductive sheet, and drying and hardening the first insulation sheet,
(B) a step of manufacturing a first sheet-connection element complex by removing a portion other than the portion functioning as the connection element from the conductive sheet constituting the first insulation sheet-conductive sheet complex manufactured in the step (A) by etching,
(C) a step of manufacturing a first insulation sheet-connection element-second insulation sheet complex by forming the second insulation sheet having opening portions having the same shape and size and formed at the same positions as in the opening portions of the first insulation sheet on the surface where the connection elements of the first insulation sheet constituting the first insulation sheet-connection element complex manufactured in the step (B) are present of the first insulation sheet by screen printing performed at least once using the same ink as the ink used in the step (A), and drying and hardening the second insulation sheet,
(D) a step of subjecting a portion extended to the opening portion of each of the connection element constituting the first insulation sheet-connection element-second insulation sheet complex manufactured in the step (C) to bending to form a contact point with a terminal of the electric device.

9. The method for manufacturing a film-shaped electrically-connecting body according to claim 8, which includes a step of plating the connection elements.

10. A method for manufacturing a film-shaped electrically-connecting body which electrically connects a plurality of electronic devices and which comprises two insulation sheets having a plurality of opening portions formed therein at a regular interval and having electrical insulation and elasticity, and a plurality of plate-shaped connection elements having conductivity and elasticity; a part of each of the connection elements being held between the two insulation sheet, the other part where the connection element is not held being extended from the portion held to the opening portion and bent to form a contact point with a terminal of the electronic device, and the two insulation sheets being film-shaped electrically-connecting bodies unified at a portion where the connection element is not present therebetween, the method comprising:

(a) a step of manufacturing a connection element sheet where a plurality of connection elements aligned at a regular interval in a flat surface direction are unitarily bonded by bridges connecting the connection elements with working the conductive sheet having conductivity and elasticity, (b) a step of forming the first insulation sheet having a plurality of openings formed therein at a regular intervals on a pedestal sheet having a flat surface by screen printing performed at least once using a material having electrical insulation and elasticity that is dissolved in a solvent and used as an ink for screen printing the first insulation sheet on the conductive sheet, (c) a step of forming a second insulation sheet having openings having the same shape and size and formed at the same positions as in the opening portions of the first insulation sheet when the second insulation sheet is superimposed on the first insulation sheet on the pedestal sheet having a flat surface by screen printing performed at least once using the same ink as the ink used in the step (b), (d) a step of manufacturing a laminate of the first insulation sheet, the connection element sheet, and the second insulation sheet by superimposing the connection element sheet manufactured in the step (a) on the first insulating sheet and then superimposing the second insulation sheet on the connection element sheet on the surface opposite to the surface in contact with the first insulation sheet at the time of half-hardened state before the ink in the surface layer portion of each of the first insulation sheet formed in the step (b) and the second insulation sheet formed in the step (c) is completely dried, (e) a step of completely drying and hardening the ink of the first insulation sheet and the second insulation sheet by, after peeling the pedestal sheet used upon screen printing of each of the first insulation sheet and the second insulation sheet from the laminate manufactured in the step (d), the laminate is subjected to a heat treatment, and (f) a step of bending the portion being extended to the opening portion of each of the connection elements to form a contact point with a terminal of the electronic device with separating the connection elements from one another by removing the bridges of the connection element sheet constituting the laminate after the ink is completely dried and hardened in the step (e).

11. The method for manufacturing a film-shaped electrically-connecting body according to claim 10, which includes a step of plating the connection elements.

* * * * *